(12) United States Patent
Chu et al.

(10) Patent No.: US 10,186,548 B2
(45) Date of Patent: Jan. 22, 2019

(54) LIGHT EMITTING DIODE DISPLAY DEVICE

(71) Applicant: Innolux Corporation, Miao-Li County (TW)

(72) Inventors: Wei-Cheng Chu, Miao-Li County (TW); Ming-Fu Jiang, Miao-Li County (TW); Gu-Jhong Jhang, Miao-Li County (TW)

(73) Assignee: Innolux Corporation, Miao-Li Country (TW)

( * ) Notice: Subject to any disclaimer, the term of this patent is extended or adjusted under 35 U.S.C. 154(b) by 0 days.

(21) Appl. No.: 15/678,128

(22) Filed: Aug. 16, 2017

(65) Prior Publication Data

US 2018/0053808 A1    Feb. 22, 2018

Related U.S. Application Data

(60) Provisional application No. 62/376,925, filed on Aug. 19, 2016.

(30) Foreign Application Priority Data

Apr. 19, 2017 (CN) .......................... 2017 1 0256720

(51) Int. Cl.
  *H01L 27/15*  (2006.01)
  *H01L 33/44*  (2010.01)
  *H01L 25/075* (2006.01)
  *H01L 33/62*  (2010.01)

(52) U.S. Cl.
  CPC ........ *H01L 27/156* (2013.01); *H01L 25/0753* (2013.01); *H01L 33/44* (2013.01); *H01L 33/62* (2013.01); *H01L 2933/0066* (2013.01)

(58) Field of Classification Search
  CPC ....... H01L 27/156; H01L 33/44; H01L 33/62; H01L 2933/0066
  See application file for complete search history.

(56) References Cited

U.S. PATENT DOCUMENTS

| | | | |
|---|---|---|---|
| 9,147,809 B1* | 9/2015 | Lin | H01L 33/38 |
| 2011/0114706 A1* | 5/2011 | Sasaoka | H01L 24/29 |
| | | | 228/164 |
| 2012/0217527 A1* | 8/2012 | Ito | H01L 33/46 |
| | | | 257/98 |
| 2015/0166847 A1* | 6/2015 | Morita | H01L 33/46 |
| | | | 257/98 |

* cited by examiner

*Primary Examiner* — Phuc T Dang
(74) *Attorney, Agent, or Firm* — JCIPRNET

(57) ABSTRACT

The disclosure provides an LED display device including a substrate, at least one first bonding pad and at least one second bonding pad, at least one spacer, at least one LED, and a conductive paste layer. The first and the second bonding pads are disposed on the substrate. The spacer is located between the first and the second bonding pads, wherein a height of the spacer is P μm. The LED is disposed on the substrate and includes a first electrode and a second electrode. The first and the second electrodes have a height H μm. The conductive paste layer is located between the substrate and the LED and includes a plurality of conductive particles. The first and the second electrodes are respectively electrically connected to the first and the second bonding pads through the conductive particles, and H+3.5 μm≥P μm≥H+0.48 μm.

9 Claims, 9 Drawing Sheets

LIGHT EMITTING DIODE DISPLAY DEVICE

CROSS-REFERENCE TO RELATED APPLICATION

This application claims the priority benefits of U.S. provisional application Ser. No. 62/376,925, filed on Aug. 19, 2016, and China application serial no. 201710256720.8, filed on Apr. 19, 2017. The entirety of each of the above-mentioned patent applications is hereby incorporated by reference herein and made a part of this specification.

BACKGROUND OF THE INVENTION

Field of the Invention

The disclosure relates to a semiconductor display device and a manufacturing method thereof, and in particular, a light emitting diode display device and a manufacturing method thereof.

Description of Related Art

As portable display products rapidly evolve, the requirements for the functions, specification, and costs of the display products are becoming more and more demanding. One of the focuses of development of the next-generation display is the energy-saving and environmental friendly display technologies. The light emitting diode (LED) used in an LED on array display device is an inorganic LED, which contributes to advantages of a long lifetime and low-current operations when compared with an active-matrix organic light-emitting diode (AMOLED) display device, which uses an organic LED.

In the manufacturing process of the LED on array display device, a conductive paste is used to bond an LED on a glass substrate including a P-type bonding pad and an N-type bonding pad, so that LED electrodes are properly bonded and electrically connected to the bonding pads on the substrate. However, in the conventional conductive paste, conductive particles are randomly dispersed, which frequently results in an issue of insufficient conductivity. Therefore, a great amount of conductive particles are generally required to enhance conductivity, which causes an issue of higher manufacturing costs. Moreover, when the LED electrodes are bonded on the bonding pads of the substrate, a number of issues often exist, such as undesirable conductivity due to an excessively large bonding gap, over-compression of the conductive particles due to an excessively small bonding gap, an insufficient contact area due to a poor bonding precision (excessive shift), or shorts resulting from connection between the P-type bonding pad and the N-type bonding pad.

SUMMARY OF THE INVENTION

The disclosure provides an LED display device exhibiting more desirable conductivity performance between an LED and a substrate thereof.

The disclosure provides a manufacturing method of an LED display device for manufacturing the foregoing LED display device.

An LED display device of the disclosure includes a substrate, at least one first bonding pad and at least one second bonding pad, at least one spacer, at least one LED, and a conductive paste layer. The first bonding pad and the second bonding pad are disposed on the substrate. The spacer located between the first bonding pad and the second bonding pad, wherein a height of the spacer is P μm. The LED is disposed on the substrate and includes a first electrode and a second electrode. The first electrode and the second electrode have a height H μm. The conductive paste layer is disposed on the substrate and is located between the substrate and the LED. The conductive paste layer includes a plurality of conductive particles, wherein the first electrode and the second electrode of the LED are respectively electrically connected to the first bonding pad and the second bonding pad of the substrate through the conductive particles, and $H+3.5\ \mu m \geq P\ \mu m \geq H+0.48\ \mu m$.

The disclosure provides a manufacturing method of an LED display device, including the following steps: providing a substrate; forming at least one first bonding pad and at least one second bonding pad on the substrate; forming at least one spacer on the substrate, wherein the spacer is located between the first bonding pad and the second bonding pad, and a height of the spacer is P μm; providing a conductive paste layer above the substrate, wherein the conductive paste layer includes a plurality of conductive particles; and bonding at least one LED on the substrate, wherein the LED includes a first electrode and a second electrode, and the first electrode and the second electrode have a height H μm. The first electrode and the second electrode of the LED are respectively electrically connected to the first bonding pad and the second bonding pad of the substrate through the conductive particles of the conductive paste layer, and $H+3.5\ \mu m \geq P\ \mu m \geq H+0.48\ \mu m$.

The disclosure further provides a manufacturing method of an LED display device, including the following steps: providing a substrate; forming a plurality of first bonding pads and a plurality of second bonding pads on the substrate, wherein the first bonding pads and the second bonding pads are alternately arranged; forming a plurality of positioning structures on the substrate, wherein the positioning structures are spaced apart from each other; providing a conductive paste layer above the substrate, wherein the conductive paste layer includes a plurality of conductive particles; providing a wafer including a growth substrate and a plurality of LEDs, wherein the LEDs are located on the growth substrate and are arranged in intervals, each of the LEDs includes a first electrode and a second electrode, and the first electrode and the second electrode have a height H μm; forming a plurality of spacers on the LEDs, wherein each of the spacers is located between the first electrode and the second electrode of each of the LEDs, and a height of each of the spacers is P μm; and bonding the wafer on the substrate, wherein the first electrode and the second electrode of each of the LEDs are respectively electrically connected to each of the first bonding pads and each of the second bonding pads of the substrate through the conductive particles of the conductive paste layer, at least two of the LEDs are located between any two of the positioning structures, and $H+3.5\ \mu m \geq P\ \mu m \geq H+0.48\ \mu m$.

In light of the above, in the LED display device and the manufacturing method thereof of the disclosure, through the spacer and the relationship between the height P μm of the spacer and the height H μm of the electrodes of the LED, i.e., $H+3.5\ \mu m \geq P\ \mu m \geq H+0.48\ \mu m$, a size of a bonding gap between the LED and the substrate is controlled, which thereby prevents issues in the prior art such as undesirable conductivity due to an excessively large bonding gap or over-compression of the conductive particles due to an excessively small bonding gap. Moreover, the arrangement of the spacer also blocks conduction among the conductive particles between the first bonding pad and the second bonding pad, which further effectively prevents electrical shorts. Therefore, the LED display device and the manufacturing method thereof of the disclosure achieve the effect of effectively controlling a deformation of the conductive particles and the bonding gap, and preventing shorts.

To provide a further understanding of the aforementioned and other features and advantages of the disclosure, exemplary embodiments, together with the reference drawings, are described in detail below.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1:
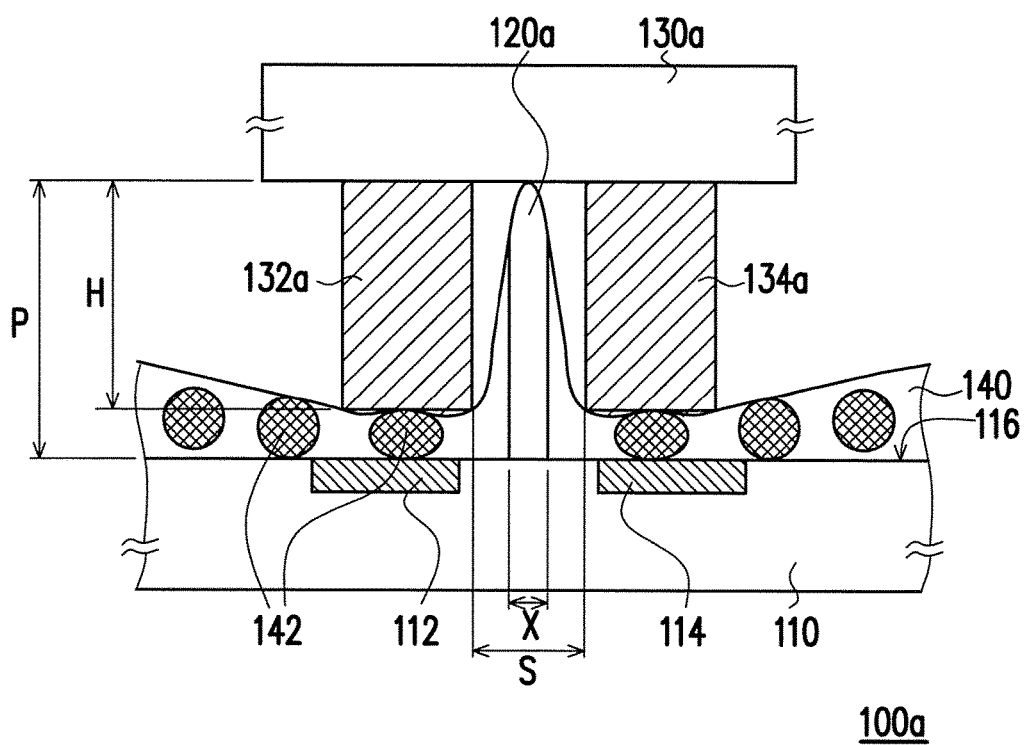
FIG. 1 is a cross-sectional schematic diagram illustrating an LED display device according to an embodiment of the disclosure.

FIG. 1 is a cross-sectional schematic diagram illustrating an LED display device according to an embodiment of the disclosure. Referring to FIG. 1, in the present embodiment, an LED display device 100a includes a substrate 110, at least one first bonding pad 112 (only one is schematically illustrated in FIG. 1), at least one second bonding pad 114 (only one is schematically illustrated in FIG. 1), at least one spacer 120a (only one is schematically illustrated in FIG. 1), at least one LED 130a (only one is schematically illustrated in FIG. 1), and a conductive paste layer 140. The first bonding pad 112 and the second bonding pad 114 are disposed on the substrate 110. The spacer 120a is located between the first bonding pad 112 and the second bonding pad 114, wherein a height of the spacer 120a is P μm. The LED 130a is disposed on the substrate 110 and includes a first electrode 132a and a second electrode 134a. The first electrode 132a and the second electrode 134a are located on a same side and have a height H μm. The conductive paste layer 140 is disposed on the substrate 110 and is located between the substrate 110 and the LED 130a. The conductive paste layer 140 includes a plurality of conductive particles 142, wherein the first electrode 132a and the second electrode 134a of the LED 130a are respectively electrically connected to the first bonding pad 112 and the second bonding pad 114 of the substrate 110 through the conductive particles 142, and H+3.5 μm≥P μm≥H+0.48 μm.

Specifically, the substrate 110 of the present embodiment includes an upper surface 116, and the first bonding pad 112 and the second bonding pad 114 are buried in the substrate 110. In other words, surfaces of the first bonding pad 112 and the second bonding pad 114 are aligned with the upper surface 116 of the substrate 110. Of course, in other unillustrated embodiments, the first bonding pad and the second bonding pad may also be disposed on the upper surface of the substrate, and the disclosure is not limited hereto. Here, the substrate 110 is, for example, a glass substrate, a flexible plastic substrate, a thin-film transistor substrate, a flexible circuit board, a printed circuit board, or another adequate substrate. Moreover, one of the first bonding pad 112 and the second bonding pad 114 is a P-type bonding pad, and the other one is an N-type bonding pad.

Furthermore, as FIG. 1 shows, the spacer 120a of the present embodiment is disposed on the substrate 110 and is located between the first bonding pad 112 and the second bonding pad 114. On the other hand, the spacer 120a is also located between the first electrode 132a and the second electrode 134a of the LED 130a. In this case, the conductive particles 142 of the conductive paste layer 140 are dispersed around the spacer 120a, and the first electrode 132a and the second electrode 134a of the LED 130a are respectively electrically connected to the first bonding pad 112 and the second bonding pad 114 of the substrate 110 through the conductive particles 142. Herein, the conductive paste layer 140 is, for example, a UV-curable anisotropic conductive film, a liquid anisotropic conductive paste, an anisotropic conductive paste, an anisotropic conductive film, or a thermosetting anisotropic conductive film, and a diameter of the conductive particles 142 is, for example, 1.2 μm to 3.5 μm.

More specifically, referring to FIG. 1 again, the height of the spacer 120a of the present embodiment is P, and the height of the first electrode 132a and the second electrode 134a is H. Preferably, the height P of the spacer 120a satisfies H+3.5≥P≥H+1.2×(1−0.6), i.e., H+3.5≥P≥H+0.48, so that the conductive particles 142 have an optimal compression (e.g., 20% to 60%). A unit of the height P of the spacer 120a and a unit of the height H of the first electrode 132a and the second electrode 134a are both μm. By configuring the height P of the spacer 120a according to the foregoing formula, a bonding gap and the compression of the conductive particles 142 at the time when the LED 130a is bonded on the substrate 110 are controlled, which thereby prevents issues in the prior art such as undesirable conductivity due to an excessively large bonding gap and undesirable conductivity performance due to over-compression of the conductive particles resulting from an excessively small bonding gap.

In addition, a width of the spacer 120a of the present embodiment is X μm, and a gap between the first electrode 132a and the second electrode 134a of the LED 130a is S μm. Preferably, the width X of the spacer 120a satisfies S μm≥X μm≥S−3.5 μm. A unit of the width X of the spacer 120a and a unit of the gap S between the first electrode 132a and the second electrode 134a are both μm. By configuring the width X of the spacer 120a according to the foregoing formula, a bonding precision (shift) at the time when the LED 130a is bonded to the substrate 110 is further controlled, which thereby prevents issues in the prior art such as undesirable conductivity performance due to an insufficient contact area resulting from an undesirable bonding precision (e.g., an excessively large shift).

In brief, in the LED display device 100a of the present embodiment, through the spacer 120a and the relationship between the height P of the spacer 120a and the height H of the electrodes of the LED 130a, i.e., H+3.5≥P≥H+0.48, a size of the bonding gap between the LED 130a and the substrate 110 is controlled, which thereby prevents issues in the prior art such as undesirable conductivity due to an excessively large bonding gap or over-compression of the conductive particles due to an excessively small bonding gap. Moreover, the arrangement of the spacer 120a also functions to block conduction among the conductive particles 142 of the conductive paste layer 140 between the first bonding pad 112 and the second bonding pad 114, which further effectively prevents electrical shorts. Therefore, the LED display device 100a of the present embodiment achieves the effect of effectively controlling a deformation of the conductive particles 142 and the bonding gap and preventing shorts.

Figure 2A:
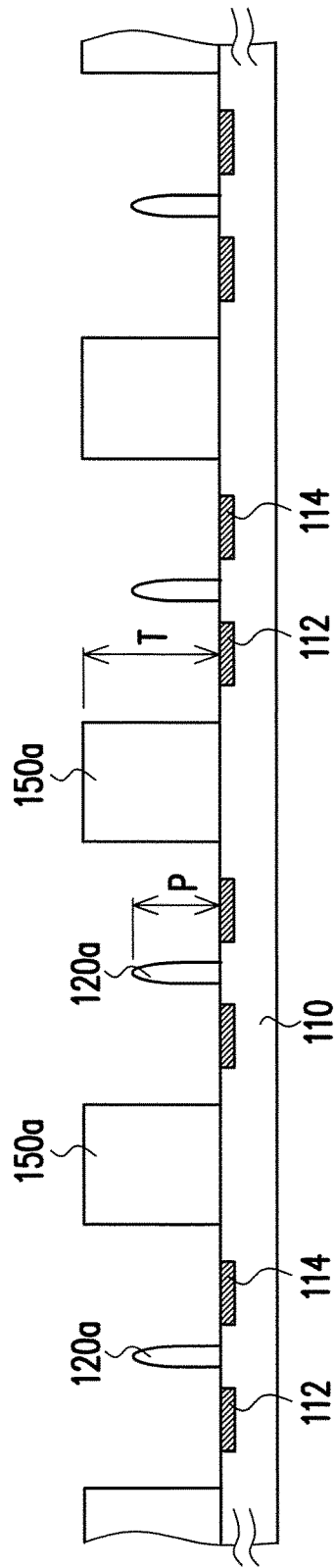
FIG. 2A to FIG. 2C are cross-sectional schematic diagrams illustrating a manufacturing method of an LED display device according to an embodiment of the disclosure.
Figure 2B:
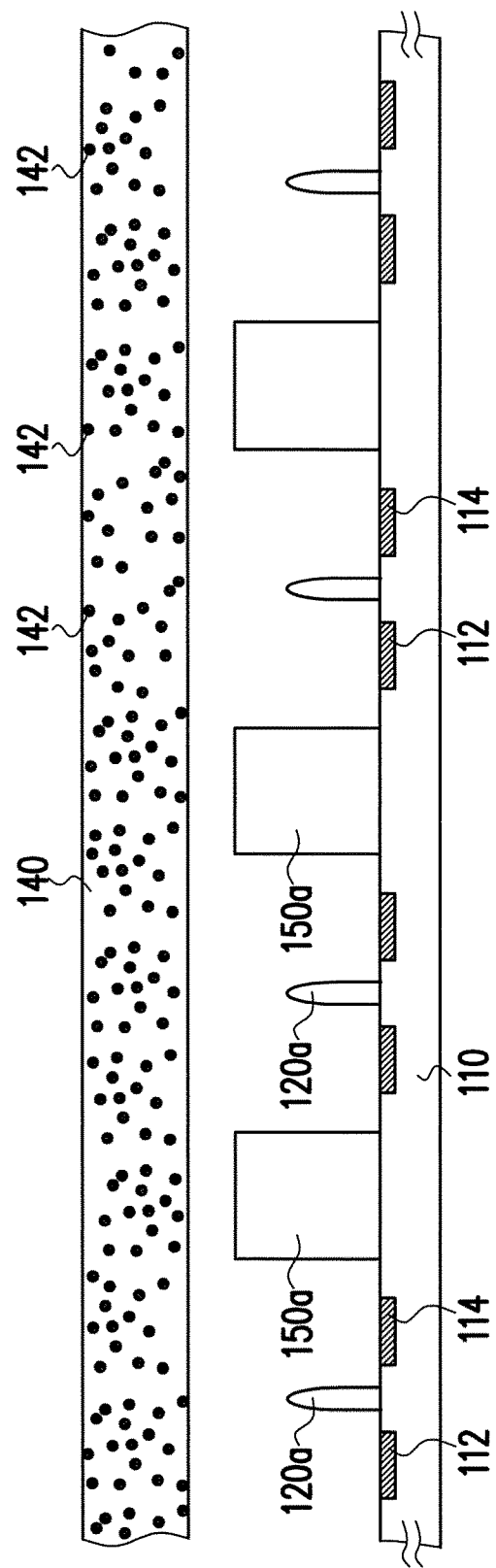
Figure 2C:
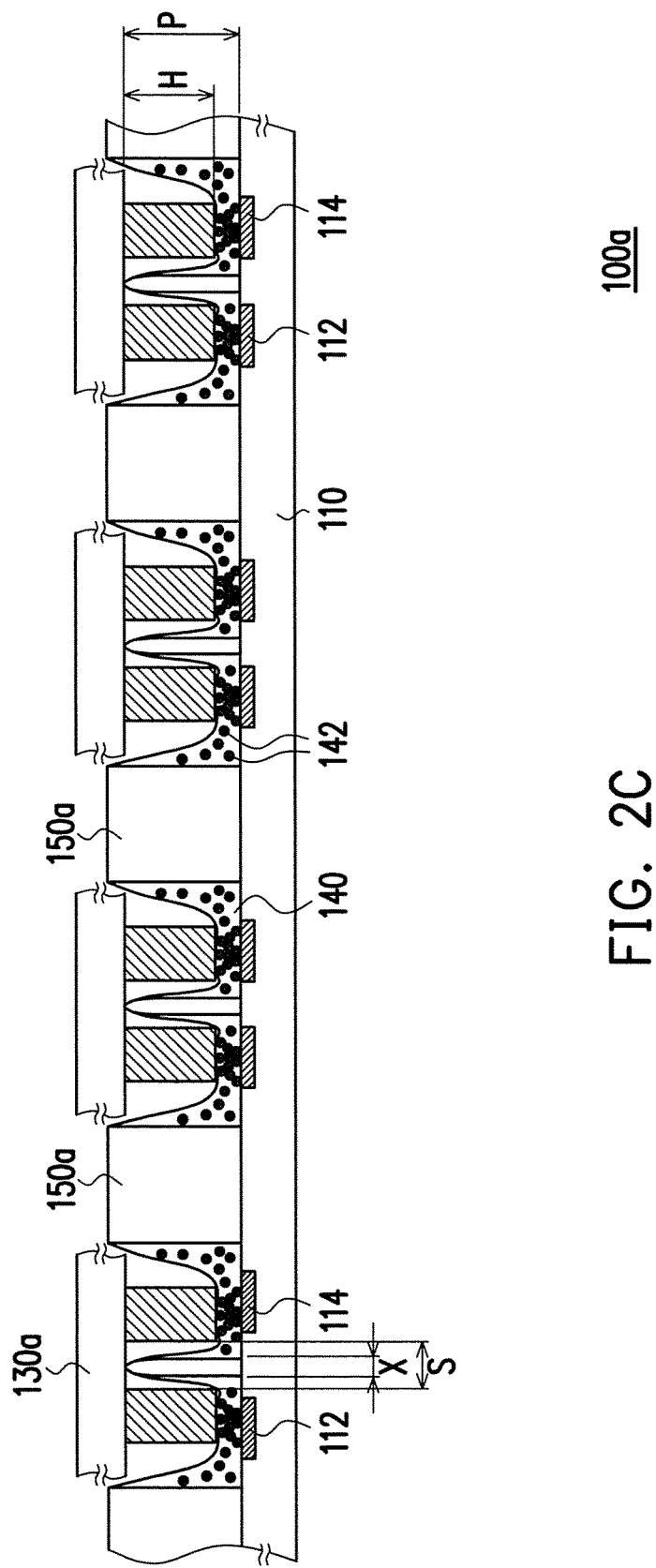

FIG. 2A to FIG. 2C are cross-sectional schematic diagrams illustrating a manufacturing method of an LED display device according to an embodiment of the disclosure. In a manufacturing process, referring to FIG. 2A first, according to a manufacturing method of an LED display device of the present embodiment, a substrate 110 is first provided. Then, at least one first bonding pad 112 (a plurality are schematically illustrated in FIG. 2A) and at least one second bonding pad 114 (a plurality are schematically illustrated in FIG. 2A) are formed on the substrate 110. Herein, the first bonding pad 112 and the second bonding pad 114 are buried in the substrate 110, and the substrate 110 is, for example, a glass substrate, a plastic substrate, a thin-film transistor substrate, a flexible circuit board, a printed circuit board, or another adequate substrate, which is not limited hereto.

Next, referring to FIG. 2A again, at least one spacer 120a (a plurality are schematically illustrated in FIG. 2A) is formed on the substrate 110, wherein the spacer 120a is located between the first bonding pad 112 and the second bonding pad 114, and a height of the spacer 120a is P. Here, a material of the spacer 120a is, for example, a black matrix or another adequate photoresist material.

Referring to FIG. 2A again, a plurality of light-shielding patterns 150a are formed on the substrate 110, wherein the light-shielding patterns 150a and the spacer 120a are alternately arranged, and a height T of the light-shielding patterns 150a is greater than the height P of the spacer 120a. Here, a material of the light-shielding patterns 150a is, for example, a black matrix or another adequate photoresist material.

Then, referring to FIG. 2B, a conductive paste layer 140 is provided above the substrate 110, wherein the conductive paste layer 140 includes a plurality of conductive particles 142. Herein, the conductive particles 142 are dispersed in the conductive paste layer 140, wherein the conductive paste layer 140 is, for example, a UV-curable anisotropic conductive film, a liquid anisotropic conductive paste, an anisotropic conductive paste, an anisotropic conductive film, or a thermosetting anisotropic conductive film.

Finally, referring to FIG. 2C, at least one LED 130a (a plurality are schematically illustrated in FIG. 2C) is bonded on the substrate 110, wherein each LED 130a includes a first electrode 132a and a second electrode 134a, and the first electrode 132a and the second electrode 134a are located on a same side and have a height H. In other words, the LED 130a of the present embodiment is specifically a horizontal-type LED but is not limited to the horizontal-type LED. When the LED 130a is bonded to the substrate 110, the first electrode 132a and the second electrode 134a of the LED 130a are respectively electrically connected to the first bonding pad 112 and the second bonding pad 114 of the substrate 110 through the conductive particles 142 of the conductive paste layer 140.

At this time, each spacer 120a is located between the first electrode 132a and the second electrode 134a of the LED 130a and effectively blocks conduction among the conductive particles 142 in the conductive paste layer 140 between the first bonding pad 112 and the second bonding pad 114, which further effectively prevents electrical shorts. The light-shielding patterns 150a and the LED 130a are alternately arranged, wherein the height T of the light-shielding patterns 150a is greater than the height H of the spacer 120a, and the height T of the light-shielding patterns 150a is also required to be greater than or equal to a height from a light-emitting layer (not illustrated) of the LED 130a to the substrate 110 to effectively prevent light emitted from two adjacent LEDs 130a from affecting each other. Moreover, the height of the spacer 120a is P μm, and the height of the first electrode 132a and the second electrode 134a is H μm. Preferably, the height P of the spacer 120a satisfies H+3.5 μm≥P μm≥H+0.48 μm, so that the conductive particles 142 have an optimal compression (e.g., 20% to 60%). Accordingly, a bonding gap and the compression of the conductive particles 142 at the time when the LED 130a is bonded on the substrate 110 are controlled. Moreover, a width of the spacer 120a is X μm, and a gap between the first electrode 132a and the second electrode 134a of the LED 130a is S μm. Preferably, the width X of the spacer 120a satisfies S μm≥X μm≥S−3.5 μm, so that a bonding precision (shift) at the time when the LED 130a is bonded on the substrate 110 is controlled. Now, the manufacturing of the LED display device is completed.

It shall be noted here that the reference numerals and part of the content of the foregoing embodiments apply to the following embodiments, wherein the same reference numerals are used to indicate the same or similar components, and descriptions of the same technical content are omitted. Reference may be made to the foregoing embodiments for the omitted descriptions, which shall not be repeated in the following embodiments.

Figure 3A:
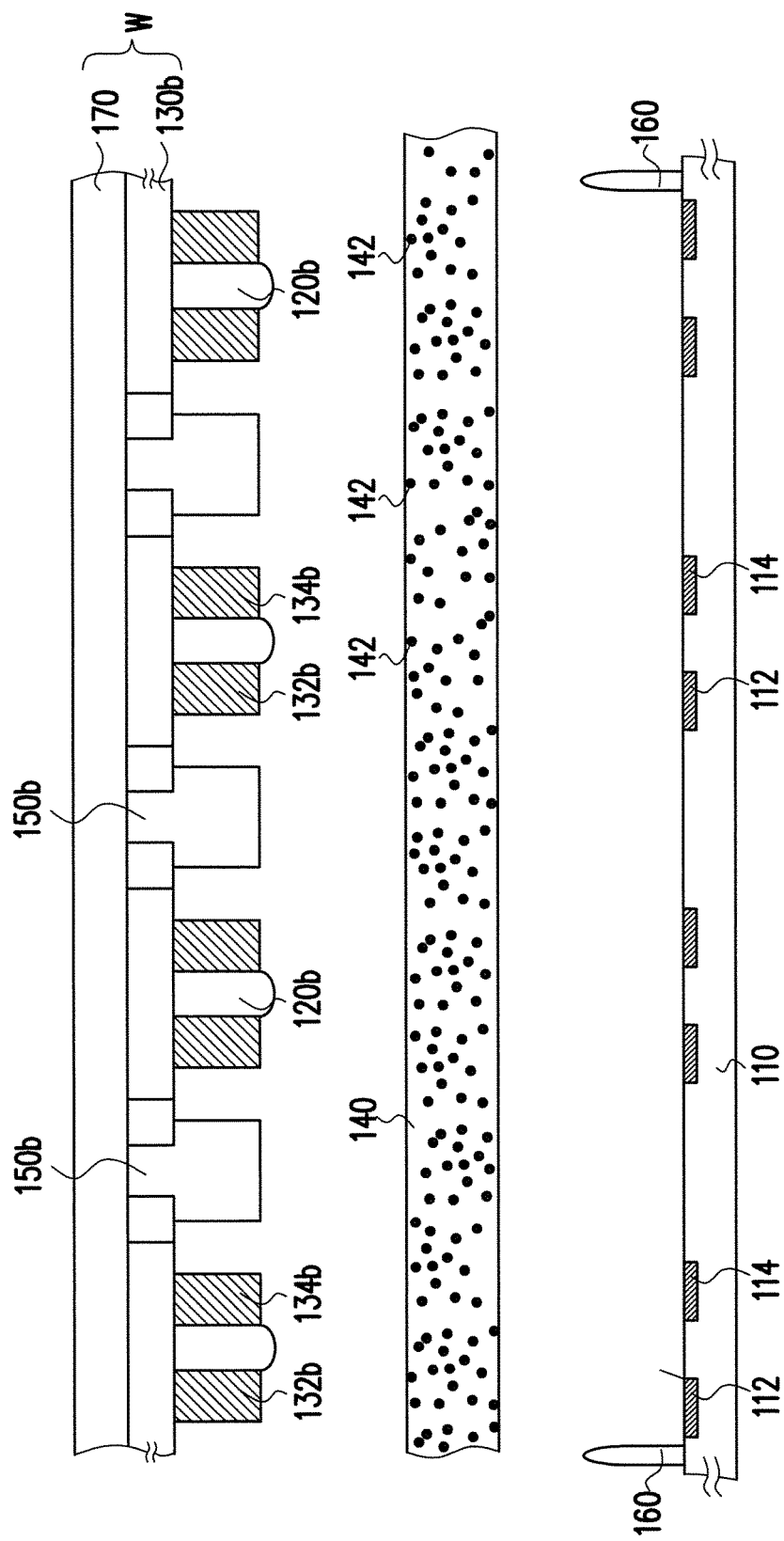
FIG. 3A to FIG. 3B are cross-sectional schematic diagrams illustrating a manufacturing method of an LED display device according to another embodiment of the disclosure.
Figure 3B:
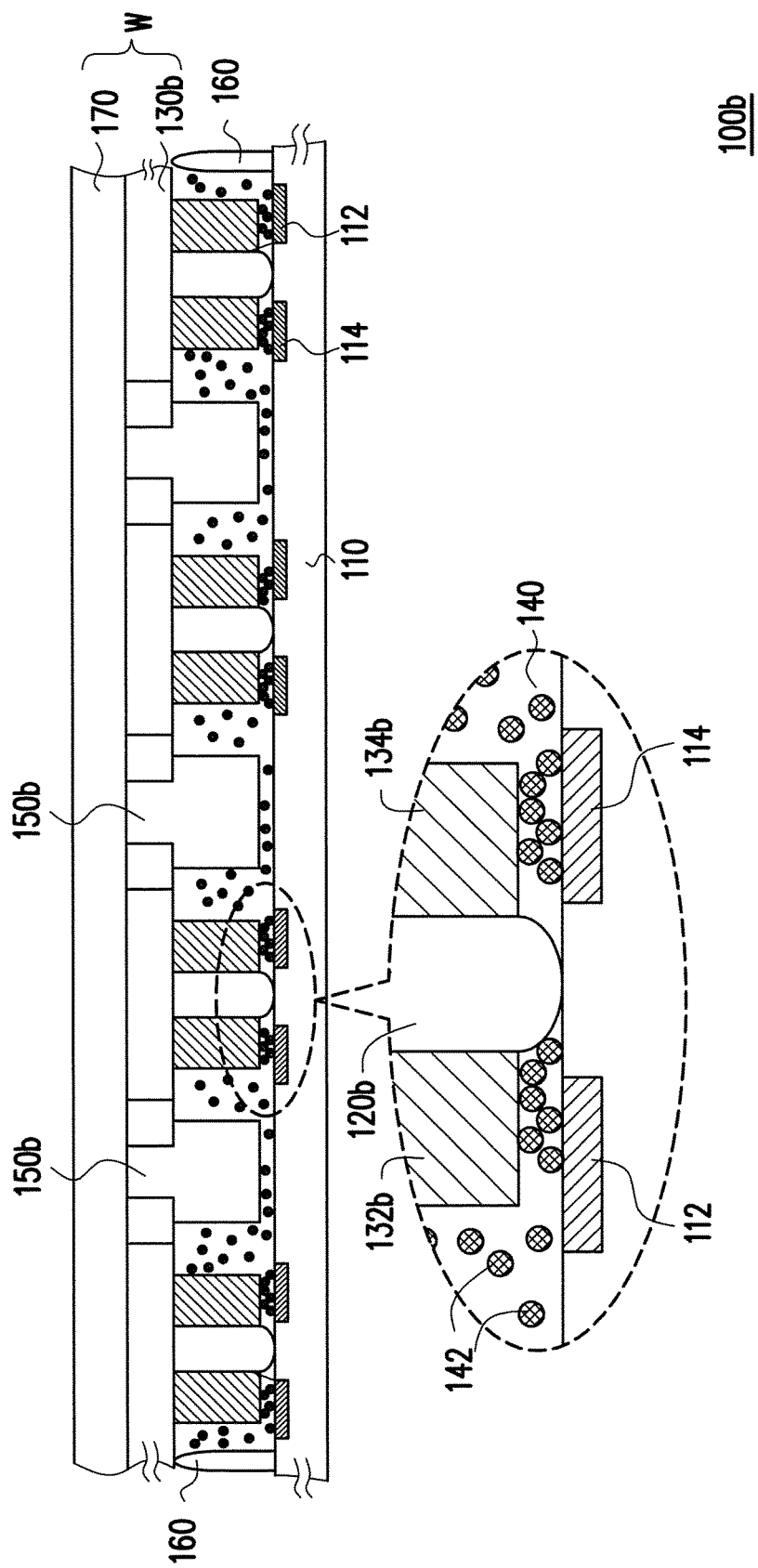
Figure 4:
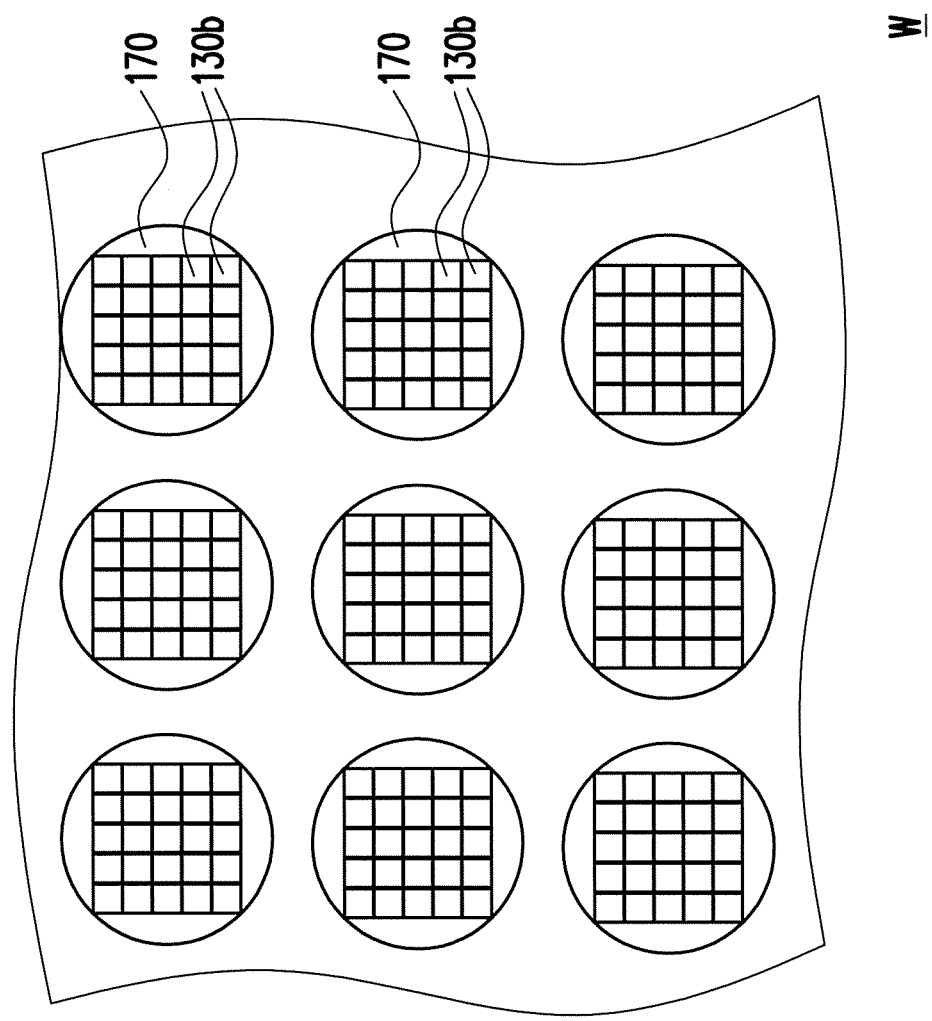
FIG. 4 is a bottom schematic diagram illustrating a wafer of FIG. 3A.

FIG. 3A to FIG. 3B are cross-sectional schematic diagrams illustrating a manufacturing method of an LED display device according to another embodiment of the disclosure. FIG. 4 is a bottom schematic diagram illustrating a wafer of FIG. 3A. For ease of illustration, FIG. 4 does not illustrate the spacer. A manufacturing method of an LED display device of the present embodiment is similar to the manufacturing method of the LED display device of FIG. 2A to FIG. 2C, and a main difference between the two lies in that a spacer 120b of the present embodiment is formed on a wafer W on which an LED 130b is located.

Specifically, referring to FIG. 3A first, a substrate 110 is provided. Then, a plurality of first bonding pads 112 and a plurality of second bonding pads 114 are formed on the substrate 110, wherein the first bonding pads 112 and the second bonding pads 114 are alternately arranged. Next, a plurality of positioning structures 160 are formed on the substrate 110, wherein the positioning structures 160 are spaced apart from each other. Herein, a material of the positioning structures 160 is, for example, a black matrix or another adequate photoresist material. Then, a conductive paste layer 140 is provided above the substrate 110, wherein the conductive paste layer 140 includes conductive particles 142. Next, referring to FIG. 3A and FIG. 4, the wafer W is provided, wherein the wafer W includes a growth substrate 170 and a plurality of LEDs 130b, and the LEDs 130b are located on the growth substrate 170 and are arranged in intervals. Specifically, the LED 130b includes a first electrode 132b and a second electrode 134b, and the first electrode 132b and the second electrode 134b are located on a same side. Afterwards, a spacer 120b is formed on the LED 130b, wherein the spacer 120b is located between the first electrode 132b and the second electrode 134b of the LED 130b. To prevent light generated by two adjacent LEDs 130b from affecting each other, a plurality of light-shielding patterns 150b are formed on the growth substrate 170, wherein the light-shielding patterns 150b and the LED 130b are alternately arranged. Here, the light-shielding patterns 150b are, for example, a black matrix but are not limited hereto.

Finally, referring to FIG. 3B, the wafer W is bonded on the substrate 110, wherein the first electrode 132b and the second electrode 134b of the LED 130b are respectively electrically connected to the first bonding pad 112 and the second bonding pad 114 of the substrate 110 through the conductive particles 142 in the conductive paste layer 140. Now, the manufacturing of the LED display device 100b is completed.

Here, the arrangement of the spacer 120b effectively blocks conduction between the first bonding pad 112 and the second bonding pad 114 due to the conductive particles 142 in the conductive paste layer 140, which further prevents shorts. On the other hand, the positioning structures 160 enable the LEDs 130b on the wafer W to be precisely and effectively controlled and aligned. Moreover, a height P of the spacer 120b of the present embodiment satisfies H+3.5 μm≥P μm≥H+0.48 μm, so that the conductive particles 142 have an optimal compression (e.g., 20% to 60%). Accordingly, a bonding gap and the compression of the conductive particles 142 at the time when the LED 130b on the wafer W is bonded on the substrate 110 are controlled. Moreover, since a width X of the spacer 120b satisfies S μm≥X μm≥S−3.5 μm, a bonding precision (shift) at the time when the LED 130b on the wafer W is bonded on the substrate 110 is controlled.

Figure 5A:
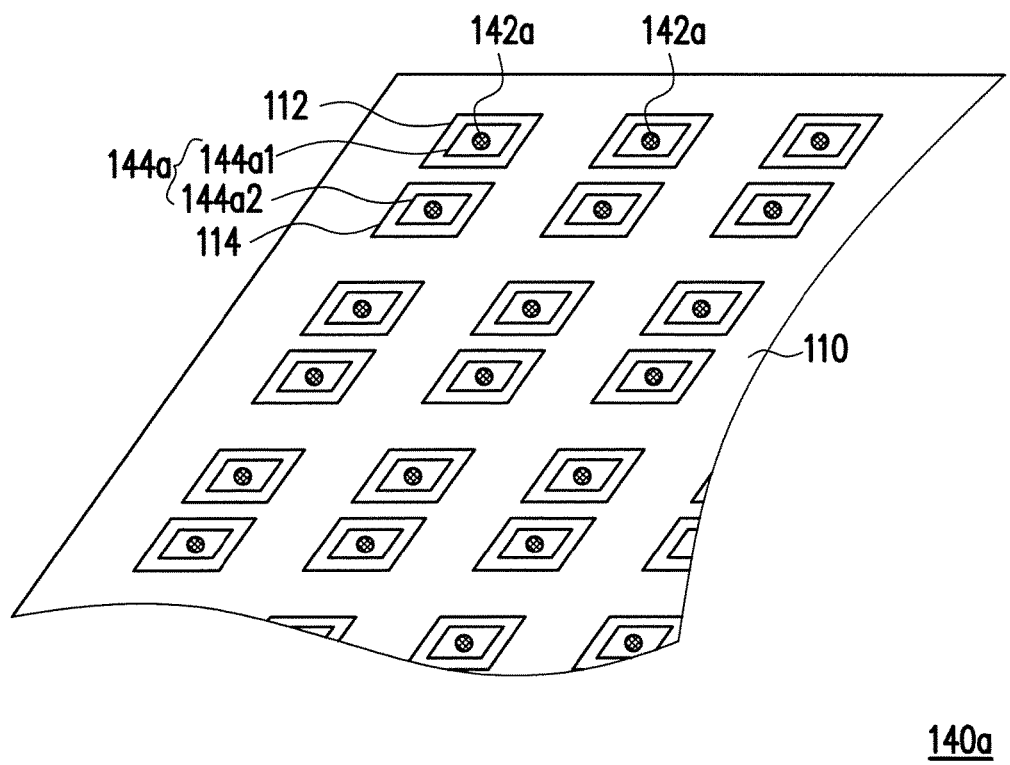
FIG. 5A to FIG. 5B are top schematic diagrams illustrating a plurality of types of a conductive paste layer according to a plurality of embodiments of the disclosure.

It shall be mentioned that the present disclosure does not limit the structural configuration of the conductive paste layer 140. In the foregoing embodiment, the conductive particles 142 are irregularly dispersed in the conductive paste layer 140. However, in other embodiments, referring to FIG. 5A, a conductive paste layer 140a includes a plurality of patterned conductive parts 144a. The patterned conductive part 144a includes a first patterned conductive part 144a1 corresponding to the first bonding pad 112 and a second patterned conductive part 144a2 corresponding to the second bonding pad 114. Here, an area of the first patterned conductive part 144a1 is smaller than an area of the first bonding pad 112, and an area of the second patterned conductive part 144a2 is smaller than an area of the second bonding pad 114. Of course, in other embodiments, the area of the first patterned conductive part 144a1 may also be greater than or equal to the area of the first bonding pad 112 and the area of the second patterned conductive part 144a2 may also be greater than or equal to the area of the second bonding pad 114. The conductive particles 142a are disposed in the first patterned conductive part 144a1 and the second patterned conductive part 144a2. Moreover, each first patterned conductive part 144a1 corresponds to one conductive particle 142a, and each second patterned conductive part 144a2 corresponds to one conductive particle 142a. Here, the conductive particles 142a are, for example, formed in the first patterned conductive part 144a1 and the second patterned conductive part 144a2 through a spray coating method.

Figure 5B:
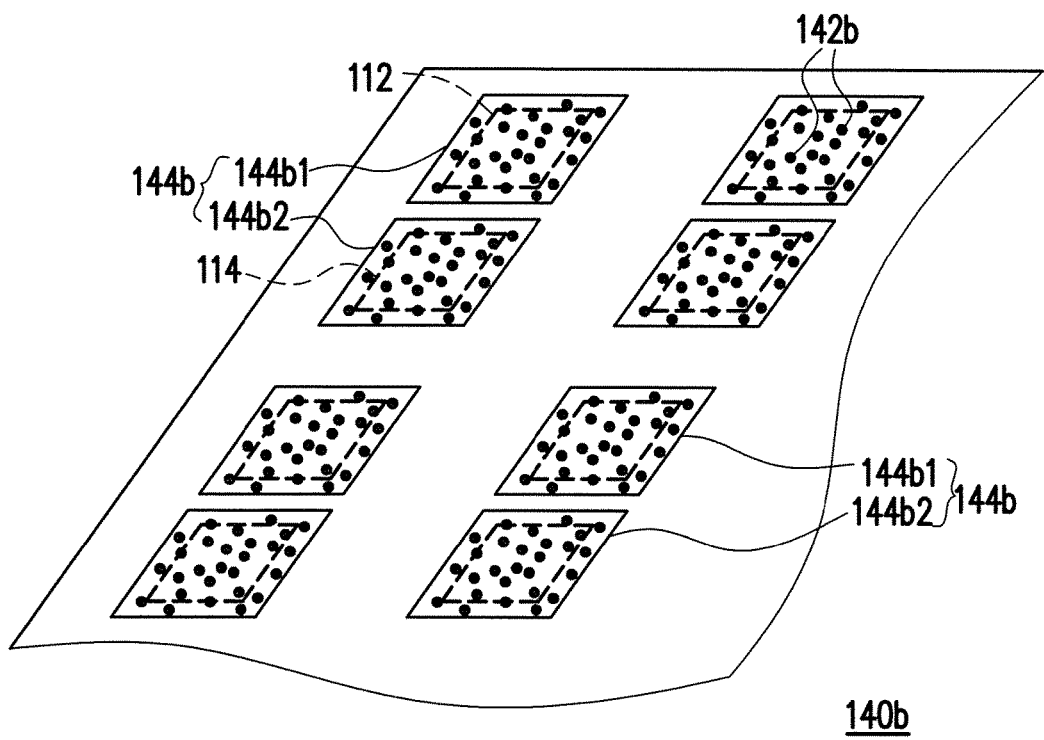

Alternatively, referring to FIG. 5B, a conductive paste layer 140b includes a plurality of patterned conductive parts 144b. The patterned conductive part 144b includes a first patterned conductive part 144b1 corresponding to the first bonding pad 112 and a second patterned conductive part 144b2 corresponding to the second bonding pad 114. Here, an area of the first patterned conductive part 144b1 is greater than the area of the first bonding pad 112, and an area of the second patterned conductive part 144b2 is greater than the area of the second bonding pad 114. Of course, in other embodiments, the area of the first patterned conductive part 144b1 may also be smaller than or equal to the area of the first bonding pad 112 and the area of the second patterned conductive part 144b2 may also be smaller than or equal to the area of the second bonding pad 114. The conductive particles 142b are dispersedly disposed in the first patterned conductive part 144b1 and the second patterned conductive part 144b2. Of course, in other embodiments, the conductive particles 142b may also be arranged in matrices in the first patterned conductive part 144b1 and the second patterned conductive part 144b2.

In summary of the above, in the LED display device and the manufacturing method thereof of the disclosure, through the spacer and the relationship between the height P of the spacer and the height H of the electrodes of the LED, i.e., H+3.5 μm≥P μm≥H+0.48 μm, the size of the bonding gap between the LED and the substrate is controlled, which thereby prevents issues in the prior art such as undesirable conductivity due to the excessively large bonding gap or over-compression of the conductive particles due to the excessively small bonding gap. Moreover, the arrangement of the spacer also blocks conduction among the conductive particles between the first bonding pad and the second bonding pad, which further effectively prevents electrical shorts. Therefore, the LED display device and the manufacturing method thereof of the disclosure achieve the effect of effectively controlling a deformation of the conductive particles and the bonding gap, and preventing shorts.

Lastly, it should be noted that the embodiments above are merely meant to describe the technical solutions of the disclosure rather than limit the disclosure. Although the embodiments above have described the disclosure in detail, any person skilled in the art shall understand that he or she may still make modifications to the technical solutions recited in the embodiments above or make equivalent replacements of part or all of the technical features therein. The modifications or replacements do not cause the nature of the corresponding technical solutions to depart from the scope of the technical solutions of the embodiments of the disclosure.

What is claimed is:

1. A light emitting diode (LED) display device, comprising:
    a substrate;
    at least one first bonding pad and at least one second bonding pad, disposed on the substrate;
    at least one spacer located between the at least one first bonding pad and the at least one second bonding pad, wherein a height of the at least one spacer is P μm;
    at least one LED disposed on the substrate and comprising a first electrode and a second electrode, wherein the first electrode and the second electrode have a height H μm; and
    a conductive paste layer disposed on the substrate and located between the substrate and the at least one LED, the conductive paste layer comprising a plurality of conductive particles, wherein the first electrode and the second electrode of the at least one LED are respectively electrically connected to the at least one first bonding pad and the at least one second bonding pad of the substrate through the plurality of conductive particles, and H+3.5 μm≥P μm≥H+0.48 μm.

2. The light emitting diode (LED) display device according to claim 1, wherein a width of the at least one spacer is X μm and a gap between the first electrode and the second electrode of the at least one LED is S μm, and S μm≥X μm≥S−3.5 μm.

3. The light emitting diode (LED) display device according to claim 1, wherein the substrate comprises a glass substrate, a flexible plastic substrate, a thin-film transistor substrate, a flexible circuit board, or a printed circuit board.

4. The light emitting diode (LED) display device according to claim 1, wherein the substrate comprises an upper surface, and the at least one first bonding pad and the at least one second bonding pad are disposed on the upper surface or embedded in the substrate.

5. The light emitting diode (LED) display device according to claim 1, further comprising:
a plurality of light-shielding patterns disposed on the substrate, wherein the at least one LED comprises a plurality of LEDs, and the plurality of light-shielding patterns and the plurality of LEDs are alternately arranged.

6. The light emitting diode (LED) display device according to claim 5, further comprising:
a plurality of positioning structures disposed on the substrate, wherein at least two of the plurality of LEDs are located between any two of the plurality of positioning structures.

7. The light emitting diode (LED) display device according to claim 1, wherein the conductive paste layer comprises a UV-curable anisotropic conductive film, a liquid anisotropic conductive paste, an anisotropic conductive paste, an anisotropic conductive film, or a thermosetting anisotropic conductive film.

8. The light emitting diode (LED) display device according to claim 1, wherein the conductive paste layer comprises a plurality of patterned conductive parts, each of the plurality of patterned conductive parts comprising a first patterned conductive part corresponding to the at least one first bonding pad and a second patterned conductive part corresponding to the at least one second bonding pad, the plurality of conductive particles are dispersedly disposed in the first patterned conductive part and the second patterned conductive part.

9. The light emitting diode (LED) display device according to claim 1, wherein the conductive paste layer comprises a plurality of patterned conductive parts, each of the plurality of patterned conductive parts comprising a first patterned conductive part corresponding to the at least one first bonding pad and a second patterned conductive part corresponding to the at least one second bonding pad, the plurality of conductive particles are disposed in the first patterned conductive part and the second patterned conductive part, the first patterned conductive part corresponds to one of the plurality of conductive particles, the second patterned conductive part corresponds to one of the plurality of conductive particles, and the plurality of conductive particles are arranged in matrices.

\* \* \* \* \*